United States Patent [19]

Kellenbenz et al.

[11] 4,217,618
[45] Aug. 12, 1980

[54] THYRISTOR FIRING CIRCUIT MODULE WITH INTEGRAL OPTICAL ISOLATION, DV/DT LIMITATION, AND BIDIRECTIONAL VOLTAGE TRANSIENT SUPPRESSION

[76] Inventors: Carl W. Kellenbenz, 106 Franklin Ave., Baltimore, Md. 21225; George R. Boney, 6930 Sollers Point Rd., Baltimore, Md. 21222

[21] Appl. No.: 845,197

[22] Filed: Oct. 25, 1977

[51] Int. Cl.$^2$ .............................................. H02H 3/20
[52] U.S. Cl. ................................ 361/56; 307/252 R; 307/305; 307/311; 361/91; 361/111
[58] Field of Search ................... 361/56, 91, 100, 110, 361/111; 363/54, 57, 58, 50, 51, 53, 56, 27, 28; 323/21, 225 C; 307/252 R, 305, 311, 315, 324, 126, 252 J, 252 UA, 252 N, 252 T, 252 M, 117

[56] References Cited
U.S. PATENT DOCUMENTS

| | | | |
|---|---|---|---|
| 3,416,002 | 12/1968 | Faust | 361/56 X |
| 3,535,532 | 10/1970 | Merryman | 307/311 |
| 3,648,060 | 3/1972 | Hagen | 307/315 X |
| 3,663,838 | 5/1972 | Reimers | 323/21 X |
| 3,723,769 | 3/1973 | Collins | 307/252 T X |
| 3,812,382 | 5/1974 | Pascente | 361/167 |
| 3,936,706 | 2/1976 | Hamstra | 361/205 X |
| 3,947,726 | 3/1976 | Dececco et al. | 361/91 X |
| 4,027,228 | 5/1977 | Collins | 307/311 X |
| 4,065,669 | 12/1977 | Bogel | 307/311 X |

*Primary Examiner*—Patrick R. Salce
*Attorney, Agent, or Firm*—R. S. Sciascia; Sol Sheinbein

[57] ABSTRACT

A thyristor firing module for use in high power circuits which provides protection against damage or misfiring. The module comprises optically isolated control circuitry optically coupled to firing circuitry which in turn is coupled to a darlington transistor pair to produce a high current drive pulse to fire the thyristor. The module also includes varistor control of voltage across the thyristor. Power for the firing circuitry is derived from the voltage across the thyristor in its non-conducting state.

6 Claims, 2 Drawing Figures

THYRISTOR FIRING CIRCUIT MODULE WITH INTEGRAL OPTICAL ISOLATION, DV/DT LIMITATION, AND BIDIRECTIONAL VOLTAGE TRANSIENT SUPPRESSION

STATEMENT OF THE GOVERNMENT INTEREST

The invention described herein may be manufactured and used by or for the Government of the United States of America for governmental purposes without the payment of any royalties thereon or therefor.

BACKGROUND OF THE INVENTION

The present invention relates to circuitry for controlling the firing of thyristors and more particularly to control circuitry for thyristors in high power applications incorporating protection against thyristor misfire or damage.

Thyristors have attained wide application in switching circuits for power supply systems. In this context, there has been demonstrated a need for circuitry capable of gating the thyristor in power applications up to several thousand volts and at the same time protecting the thyristor from misfiring and/or being damaged. It is desirable that such gating circuitry embody certain functions; viz., isolation of control circuitry from the thyristor, high gate drive capability and protection of the thyristor from misfiring and or being damaged.

A number of techniques for isolating a thyristor from its control circuitry have been developed. Usually this is accomplished by utilizing some form of a transformer, such as a pulse transformer, for thyristor gating. The disadvantage of using transformers for thyristor gating are the transformers have relatively high capacitive coupling between the windings unless extensive shielding is employed. This capacitive coupling can allow noise current to flow from the power line into the control circuits if high rate of changes of voltages exist between the power line and the control circuits. These currents will flow in accordance with the relationship:

$$i = c(dv/dt)$$

where
- i = current flowing into control circuit
- c = capacitance between windings of thyristor gating transformer
- dv/dt = rate of change of voltage between the power line and the control circuit This current will contain high frequency components and can produce voltage drops along the control circuit common (control circuit power return or reference) of sufficient amplitude as to cause a malfunction of the control logic. This will usually result in a misfiring of thyristors.

Further, when transformers are employed for thyristor gating, a separate power supply must be employed to provide power for the "high gate drive" circuitry.

Certain prior art methods of optical isolation employ photo-SCRs to optically couple the control circuitry to the thyristor and, generally, these function well. These devices comprise a light emitting diode (LED) and an SCR that is "gated-on" optically when current is passed through the diode causing light to be emitted thus actuating the SCR. This device is made as a unit wherein the package contains the light emitting diode and light sensitive SCR, and has a very low capacitive coupling between the input LED and the output light sensitive SCR. Because of the low capacitive coupling between the input and output, typically 2.0 picofarads, it would appear that this device would have the capability of giving the desired isolation between power line and control circuit as well as the capability of providing the high gate drive. However, it has been found that this device has at least one very serious limitation which precludes its use in many applications. The light sensitive SCR possesses a dv/dt (rate of change of voltage from anode to cathode) rating that is largely a function of the resistance used to terminate the gate to cathode junction. The current required to flow through the LED to cause the SCR to be "gated-on" is also a function of the resistance terminating the gate to cathode junction. Usually, the resistance for terminating this junction cannot be satisfactorily chosen so that the SCR will have an adequate dv/dt rating and at the same time require tolerable values of current through the LED for gating the SCR. Another disadvantage of this type device is that the SCR is only available with a peak inverse voltage rating to 400 volts. This would limit the usage of the device to systems where the voltage across the thyristor to be "gated-on" has a maximum RMS value of 240 V.A.C. the device would therefore not be useful on 440 to 480 volt systems.

As for providing a high gate drive capability, a darlington transistor pair is well suited to perform this function. However, in high power applications, it is expedient to provide circuitry for increasing the off-state blocking voltage capability of a darlington configuration since the voltage across the configuration can go from a very low value to a very high value (possible several thousand volts) when the thyristor is switched from a conducting to a non-conducting state. And, finally, means for protecting the thyristor from damage or misfiring is advisable in high power applications high rate of rise of voltage across the thyristor.

SUMMARY OF THE INVENTION

Accordingly, the present invention provides a thyristor firing module comprising an optically isolated control circuit optically coupled to an inversion and clamping circuit. The inversion and clamping circuit controls circuitry for providing a high gate drive pulse current to a thyristor gate terminal, thus firing the thyristor. To control large voltage transients and high rate of rise of voltage across the thyristor, an RC snubber and varistor protection circuit coupled across the thyristor is provided in the thyristor firing module itself. The power for the gating of the thyristor is derived from the voltage across the thyristor when the thyristor is in the non-conducting state.

OBJECTS OF THE INVENTION

It is therefore an object of the present invention to provide a firing module for a thyristor.

Another object of the present invention is to insure the gating of thyristors only upon a true signal.

A still further object of the present invention is to minimize electrical coupling between thyristor control circuits and the thyristor power line.

Yet still another object of the present invention is to provide a fast rising high amplitude thyristor gating pulse to allow switching of load currents where the rate of change of current is high.

A further object of the present invention is to provide a thyristor firing module which controls all possible forms of thyristor misfiring except for defects in the thyristor itself or improper operation of the control circuits.

Another object of the present invention is to provide a thyristor firing module in which the power for the gating of the thyristor is derived directly from the voltage across the thyristor when the thyristor is in the non-conducting state.

Still another object of the present invention is to provide a thyristor firing module which allows the entire thyristor firing module to be mounted to the heat sink of the thyristor.

Yet another object of the present invention is to provide a thyristor firing module which requires only three thyristor connection leads, anode, cathode and gate and two input leads.

A still further object of the present invention is to provide a thyristor firing module which incorporates optical isolation of control circuitry, high gate drive capability and protection against thyristor misfiring due to voltage transients and high rates of rise of voltage across the thyristor.

Yet still another object of the present invention is to reduce interference existing in thyristor control circuits.

Another object of the present invention is to protect thyristors against damage or improper gating by suppressing voltage transients.

Still another object of the present invention is to provide a high gate current thyristor pulse and a high degree of isolation between the power line and control circuitry of the thyristor.

Another object of the present invention is to provide a thyristor firing module which can be used in high power applications and which employs readily available components.

Still another object of the present invention is to provide a thyristor firing module which is economical to manufacture and efficient in operation.

BRIEF DESCRIPTION OF THE DRAWINGS

Other objects and many of the attendant advantages of the present invention will be readily apparent as the invention becomes better understood by reference to the following detailed description with the appended claims, when considered in conjunction with the accompanying drawing, wherein:

DESCRIPTION OF THE PREFERRED EMBODIMENT

Figure 1:
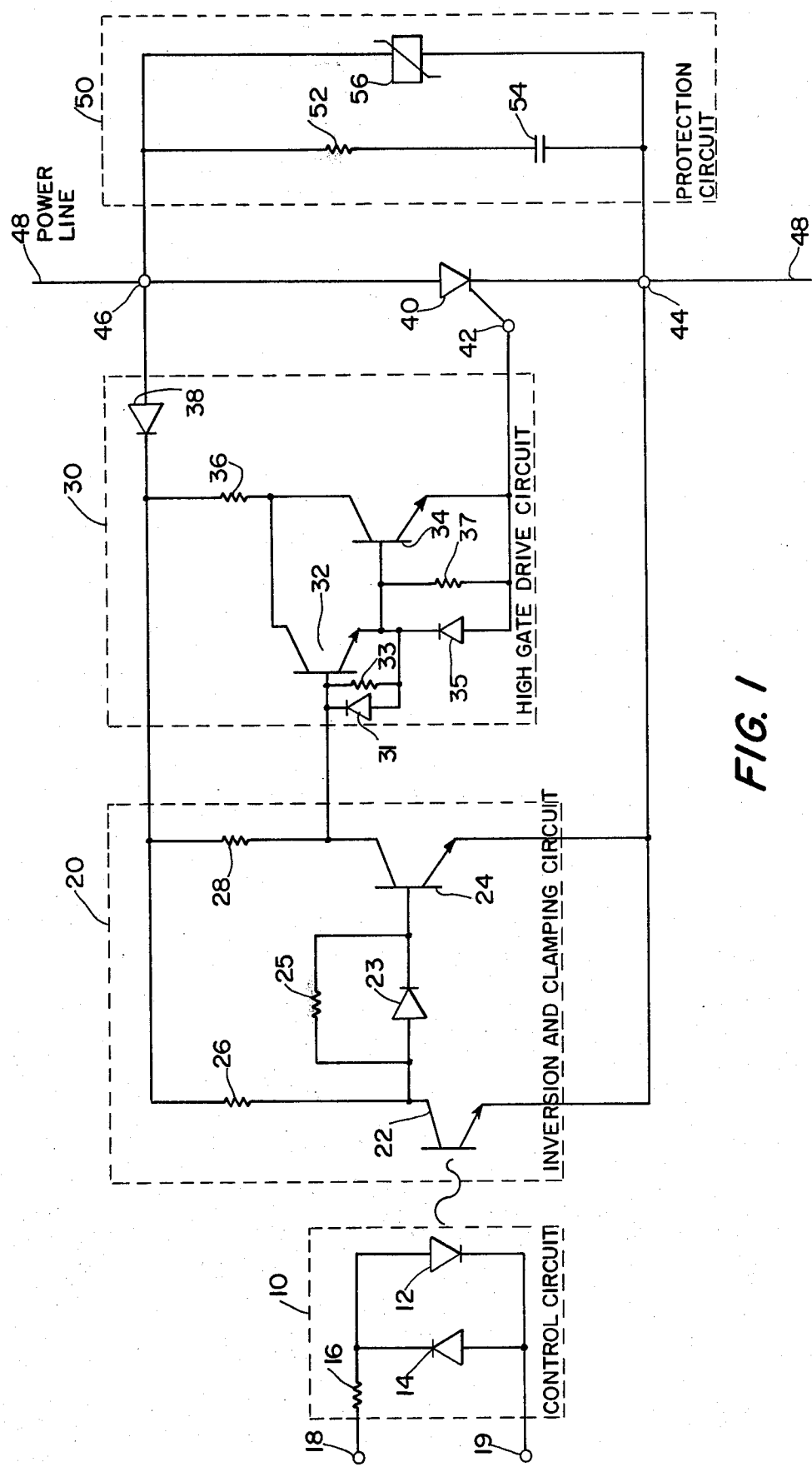
FIG. 1 is a circuit diagram of the thyristor firing module connected to a thyristor according to a first embodiment in the present invention.

Referring now to the drawings, wherein like referenced characters represent corresponding elements throughout the several views, and more specifically to FIG. 1, the thyristor firing module is coupled to thyristor 40 at its anode terminal 46, cathode terminal 44 and gate terminal 42. The structure and function of the thyristor firing module will be developed in terms of its four principal stages, viz., a control circuit 10, an inversion and clamping circuit 20, a high gate drive circuit 30 and a protection circuit 50. The thyristor 40 to which the thyristor firing module is coupled controls the flow of power along a power line 48 to which it is coupled at anode terminal 46 and cathode terminal 44. The module is mounted on the heat sink (not shown) of the thyristor 40.

The firing of thyristor 40 is controlled by an input signal to the control circuit stage 10 at input terminals 18 and 19. Terminal 18 is coupled through a resistor 16 to a light emitting diode (LED) 12 and a diode 14 connected inversely and in parallel thereto. LED 12 optically couples control circuit 10 to a photo-transistor 22 located in inversion and clamping circuit 20. The base of clamping transistor 24 is coupled to the collector of photo-transistor 22 through a parallel combination of a resistor 25 and a diode 23. Power is supplied to inversion and clamping circuit 20 from power line 48 coupled both through a diode 38 and a resistor 28 to the collector of transistor 24 and through resistor 26 to the collector of phototransistor 22. The signal output of inversion and clamping circuit 20 is obtained from the collector of transistor 24 and is coupled to the base of transistor 32 located in high gate drive circuit 30. High gate drive circuit 30 comprises, inter alia, a pair of transistors 32 and 34 arranged in a darlington configuration, with the emitter of transistor 32 connected to the base of transistor 34 and the collector of both transistors connected together. As with inversion and clamping circuit 20, power is supplied to high gate drive circuit 30 from power line 48, in this case through diode 38 and resistor 36 to the collectors of each of the transistors 32 and 34. The output of high gate drive circuit 30 is a current pulse from the emitter of transistor 34 which is coupled to gate electrode 42 of thyristor 40.

The protection of thyristor 40 from misfiring and damage due to voltage transients or a high rate of rise of the voltage across thyristor 40 is provided by protection circuit 50 coupled across anode electrode 46 and cathode electrode 44 of the thyristor. Protection circuit 50 comprises the parallel combination of a resistor 52 in series with a capacitor 54, and a varistor 56.

The mode of operation of the thyristor firing module will now be described. In response to an input firing signal to control circuit 10, LED 12 will radiate. Resistor 16 is chosen so that the current through LED 12 is limited to approximately 40 milliamperes. The function of diode 14 is to protect LED 12 from possible damage due to high reverse voltages by limiting the maximum reverse voltage across the LED to the forward voltage drop of diode 14, approximately 0.7 volts. The radiation output of LED 12 will cause photo-transistor 22 to saturate, conducting a minimum collector current equal to 20 percent of the current flowing through LED 12. Resistor 26 is chosen so that the current through photo-transistor 22 is limited to a value which will always permit the photo-transistor to be driven into saturation by LED 12 by limiting it to 20% of the current through LED 12. Also, resistor 26 must provide sufficient base current to transistor 24 to keep it saturated when photo-transistor 22 is not conducting. When photo-transistor 22 saturates, the base and the emitter of transistor 24 are shorted through resistor 25, causing transistor 24 to switch out of saturation and become non-conductive.

Diode 23 performs a dual function. In combination with the emitter-base diode of transistor 24 it insures that the collector-emitter voltage across photo-transistor 22 will never exceed 1.4 volts even when the photo-transistor is not conducting current. This is an important design aspect of inversion and clamping circuit 20 since it allows an LED/photo-transistor type optical isolator to be used in controlling the firing of a thyristor where high voltage is present in the gating network. This is necessary because presently available phototransistors have a maximum collector to emitter breakdown voltage of approximately 30 volts. The configuration of the inversion and clamping circuit 20 clamps the voltage across photo-transistor 22 to a maximum of 1.4 volts even though the voltage across the thyristor could be thousands of volts. In addition, diode 23 also insures that no base current flows to transistor 24 when phototransistor 22 is saturated. Diode 23 does this by contributing a 0.7 volt drop to add to the 0.7 volt of the base-emitter junction of transistor 24. Thus, when phototransistor 22 is saturated, its collector to emitter voltage being only a few tenths of a volt, no current will flow to the base of transistor 24 to switch it into the conducting state. Resistor 25 is placed across diode 23 to prevent the base of transistor 24 from floating and picking up noise when photo-transistor 22 saturates.

As will be described more fully hereinafter, transistor 24 serves to couple the output of the inversion and clamping circuit 20 to high gate drive circuit 30 and thus control the high gate drive signal which fires the thyristor 40. However, transistor 24 serves several other key functions. In the absence of a firing signal, transistor 24 is in a conducting state, photo-transistor 22 being non-conducting, placing a short across the series connected base-emitter junctions of the darlington pair transistors 32 and 34 in high gate drive circuit 30. The shorting of the base-emitters of the darlington pair transistors 32 and 34 decreases the chance of having the darlington pair transistors going improperly into conduction. In addition, transistor 24 provides a 180 degree signal inversion so that the inversion and clamping circuit 20 will provide a firing signal in the presence of a positive input to control circuit 10 rather than in the absence of such a signal.

The output of the inversion and clamping circuit 20 is coupled to high gate drive circuit 30 by means of the coupling of the collector of transistor 24 to the base of transistor 32. Transistors 32 and 34 which make up the darlington pair are in a nonconducting state when transistor 24 in inversion and clamping circuit 20 is saturated, as is the case when photo transistor 22 is nonconducting. When transistor 24 switches to a nonconducting state in response to the saturation of photo-transistor 22, the base-emitter junctions of the darlington transistors 32 and 34 are no longer shorted. This allows base current to flow through resistance 28 to the base of transistor 32, causing the darlington pair transistors 32 and 34 to become conductive. With these transistors saturated, a current of approximately one ampere will flow through resistor 36 and the collector-emitter junction of transistor 34 to gate electrode 42 of thyristor 40. This one ampere current through transistor 34 has a rise time of less than 0.1 microseconds so as to insure that thyristor 40 can be gated on into loads where the rate of rise of current is very high (greater than 100 amperes per microsecond). Resistors 33 and 37, connected base to emitter on transistors 32 and 34, respectively, provide termination of the transistor base-emitter junctions and thus insure a higher off-state blocking voltage (collector-emitter) capability of the transistors. This higher voltage capability exists since many high voltage power transistors possess a higher $V_{CER}$ rating (breakdown voltage collector to emitter with a specified resistance connected between base and emitter) than a $V_{CEO}$ rating (breakdown voltage collector to emitter with the base open). Diodes 31 and 35 are connected with the cathode to the base and anode to the emitter of transistors 32 and 34, respectively. These diodes, in conjunction with transistor 24, place a short-circuit between thyristor gate electrode 42 to cathode electrode 44 during times when there is an absence of a control command to gate on thyristor 40. This short-circuiting of the gate to cathode junction of thyristor 40 during times when it is desired to have the thyristor remain in in the nonconducting state, helps insure that thyristor 40 will not be falsely gated on by eliminating any pickups by the thyristor gate lead and by improving the dv/dt rating of the thyristor (dv/dt rating is a function of the termination of the gate to cathode junction for many thyristors).

Diode 38 functions to prevent destructive reverse currents off the power line 48 from flowing through transistors 22, 24, 32 and 34 of the thyristor firing module and from flowing through gate electrode 42 of thyristor 40. As added protection for thyristor 40, as well as to prevent possible misfiring due to voltage transients and high rates of rise of voltages thereacross, protection circuit 50 has been incorporated into the thyristor firing module. To afford protection against thyristor misfiring or damage as a result of excessive voltage transients, protection circuit 50 includes metal oxide varistor 56 which clamps the voltage transient to a value that is lower than the breakover voltage of thyristor 40 for both forward and reverse voltage transients. To provide a limitation on the rate of rise of the voltage across thyristor 40, protection circuit 50 includes RC snubber circuit comprising resistor 52 and capacitor 54 in series with each other and across anode electrode 46 and the cathode electrode 44 of thyristor 40. This RC snubber network provides a time constant which limits the rate of rise of voltage across thyristor 40 to a value of less than 100 volts per microsecond. The RC network is effective because of the small inductance normally found in the power circuit.

In summary, when current flows through LED 12, photo-transistor 22 saturates, shorting the base to emitter of transistor 24 through resistor 25 causing transistor 24 to become nonconductive. This causes base current to flow through resistor 28 to darlington transistors 32, 34, causing transistor 34 to saturate whereby one ampere of current will flow from the anode 46 of thyristor 40 through diode 38 through resistor 36 and transistor 34 to the gate 42 of the thyristor, causing the thyristor to gate on rapidly.

While not limiting the disclosure to the following elements and values, representative elements that may be employed in FIG. 1 may be as follows:
Resistor 16—270 ohms
Diode 14—1N4005
LED 12/Phototransistor 22—General Electric H15A1
Resistor 25—470 ohms
Resistor 26—47,000 ohms
Resistor 28—47,000 ohms
Diode 23—1N4005
Transistor 24—2N2218A
Transistor 32—2N3439
Transistor 34—2N3439
Resistor 36—180 ohms
Diode 38—1N4007
Resistor 52—10 ohms
Capacitor 54—0.1 ufd. 500 v.
Varistor 56—General Electric V130LA10

As configured with the components indicated in FIG. 1, the module can be used to control the gating of thyristors where the maximum peak anode to cathode voltage across the thyristor 40 is 350 volts. By changing the resistor values and by providing replacement components with higher voltage ratings for varistor 56, capacitor 54, diode 38 and transistors 34 and 36, the module may be designed to provide gating for thyristors where the maximum peak anode to cathode voltage across the thyristor is 3000 volts. With this capability, the module can be designed to be compatible with most any thyristor that is presently available as an off-the-shelf device. To provide a module with a 3000 volt capability, one of the key components is the high voltage transistor that is used for transistors 32 and 34. A transistor which is available and can be used for this module is a Toshiba transistor type S1206A. For slightly less voltages (1500 volts) a Toshiba 2SC1172B may be used. Proper values for the components should be considered when using such Toshiba transistors.

In some cases it may be desirable to utilize a separate power supply to provide power to module elements 20 and 30 rather than rely on the voltage across thyristor 40 when it is in the non-conducting state. There are two conditions that can exist in certain applications which may require that the firing circuit module contain an internal power supply for circuits 20 and 30. These conditions are as follows:

1. The application could be such that once thyristor 40 is gated on, the current through the thyristor may fall below the thyristor holding current and the thyristor may return to the nonconducting state. In certain applications where this may occur, the circuit design or application may be such that there exists a restriction on the buildup of voltage across thyristor 40 and therefore the firing module may be unable to provide successive gating of the thyristor.

2. The application could be such to that timing problems exist between the buildup of the voltage across thyristor 40 and the occurrence of a control pulse to initiate thyristor gating. If the control pulse occurs before the voltage rises across the thyristor to a sufficient level to allow gating, then the thyristor will not gate "on". This problem could usually be solved by delaying the control pulse until the voltage across the thyristor is sufficient to allow gating. In this case, an internal power supply for circuits 20 and 30 would not be necessary.

Figure 2:
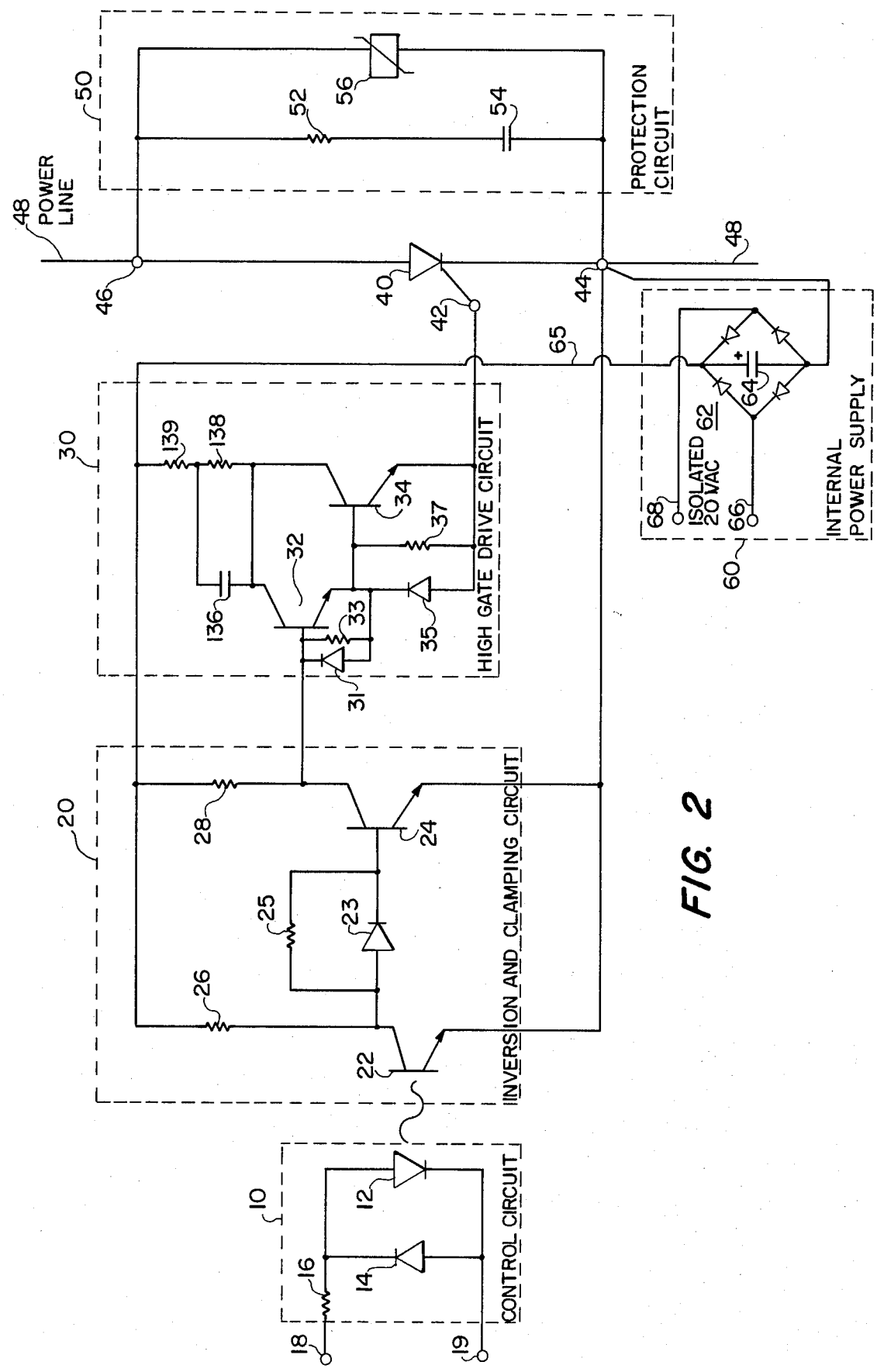
FIG. 2 is a circuit diagram of the thyristor firing module connected to a thyristor according to a second embodiment of the present invention.

Referring now to FIG. 2, the firing circuit is modified for operation with an internal power supply. To utilize this configuration, an isolated 20 volt A.C. source terminals 66 and 68 is required for each firing circuit module. To provide optimum electrical noise immunity, this 20 volt source should be derived from a shielding winding of a transformer (not shown). The basic operation of the firing circuit of FIG. 2 is essentially the same as that of FIG. 1. Circuit module 10, 20, and 50 perform exactly as described hereinabove. An internal power supply module 60 has been added to convert the 20 volt A.C. input power to a fixed D.C. voltage of approximately 28 volts. A conventional bridge rectifier 62 comprising four diodes, such as Varo, Inc. type VH647, and a conventional electrolytic capacitor 64 connected between the cathode and anodes thereof provides this conversion feature. Thyristor cathode electrode 46 is connected to the anodes of the diodes.

The fixed D.C. voltage provides power to circuits 20 and 30 through line 65 and thus makes the gating capability of the module independent of the voltage across the thyristor. Drive circuit 30 is configured slightly different from that in FIG. 1. Diode 38 has been removed, resistors 138 and 139 have replaced resistor 36, and capacitor 136 is connected between the terminal between resistors 138 and 139 and the collector of transistor 32 to provide an initial high gate drive capability (approximately one ampere gate pulse) to thyristor 40. At the instant darlington connected transistors 32 and 34 become conductive in response to a control signal on terminals 18 and 19, capacitor 136 is in the discharged state and thus looks like a short-circuit across resistor 138. Resistor 139 is selected to provide a one ampere current from the internal 28 volt D.C. supply when resistor 38 is shorted. During the initial turn-on of darlington connected transistors 32 and 34, a one ampere peak current flows but this current value decays exponentially as capacitor 136 charges. The final value of gate current to the thyristor 40 is determined by the total series resistance of resistors 138 and 139. Resistors 138 and 139 are chosen such that the continuous gate current to the thyristor 40 when the darlington connected transistors 32 and 34 are conducting is maintained just below the level of gate current that will produce the maximum rated gate power dissipation in thyristor 40. It should be noted that the circuitry to provide the high initial pulse (one ampere) followed by a tapering off of current to a lower value is necessary to provide the high gate drive capability during thyristor turn-on and at the same time insure that the continuous gate power dissipation in the thyristor is not exceeded. Maintaining a continuous current of one ampere to the thyristor would cause the gate power dissipation to exceed that of the thyristor rating.

Therefore, it is apparent that the disclosed system for firing a thyristor provides an integral thyristor firing module which can be mounted on the heat sink of the thyristor. The thyristor firing module will dependably provide firing signals to the thyristor while at the same time affording protection against the problems of thyristor misfire or damage which are experienced in high-power switching circuits employing thyristors. In addition to this protection, the module offers optical isolation and low capacitive coupling between the control circuitry and the high gate drive. The thyristor can be safely gated on into loads having high rate of current change due to the high gate drive. The power for gating the thyristor is derived from the voltage across the thyristor when it is nonconducting, enabling the module to be mounted on the heat sink of the thyristor using minimum external lead connections.

The only connections required are the three leads that connect to the gate, cathode, and anode of the thyristor; and two leads from the control circuit which supply the control signal for the module (to the LED of the optical isolator). This module allows the user to employ very short (less than 6 inch) leads to the thyristor, and have leads which are optically isolated from the power circuit as the only leads returning to the control circuit. There should be minimum capacitance (2.0 picofarads or less) between the power and control circuits and there should be maximum effectiveness of the dv/dt limitation and voltage transient suppression (due to close proximity to thyristor).

Obviously, other embodiments and modifications of the present invention will readily come to those of ordinary skill in the art having the benefit of the teachings presented in the foregoing description and the drawings.

The foregoing embodiments discloses high gate drive circuit 30 as comprising a single pair of darlington connected transistors. However, it should be noted that more than two transistors can be connected in a darlington configuration if greater gate driving capability is desired. Thus, three or more transistors may have to be connected in a darlington configuration to obtain sufficient gain in high gate drive circuit 30 to provide the thyristor firing module with the capability of controlling 3000 volt thyristors.

It is, therefore, to be understood that this invention is not to be limited thereto and that said modifications and embodiments are intended to be included within the scope of the appended claims.

What is claimed and desired to be secured by Letters Patent of the United States is:

1. A circuit for firing a thyristor into its conducting state, said thyristor having an anode electrode, cathode electrode and gate electrode, said circuit and thyristor being connectable to a power supply, said circuit deriving energy from the voltage across said thyristor when said thyristor is in its non-conducting state comprising:
   first circuit means for providing a gating signal in response to an input signal and comprising a light emitting diode for radiating light in response to said input signal,
   second circuit means for providing a firing signal upon receipt of said gating signal and comprising a phototransistor for detecting the light radiation of said light emitting diode, a first resistor coupled to the collector of said phototransistor for limiting the current in said phototransistor, said phototransistor being drivable into saturation upon detection of said light radiation, a transistor coupled to the collector of said phototransistor, said transistor being saturatable when said phototransistor is non-conducting, and non-saturable when said phototransistor is conducting, said transistor providing said firing signal, and a second diode coupled between the collector of said phototransistor and the base of said transistor for limiting the collector-emitter voltage across said phototransistor and for precluding current flow to the base of said transistor when said photo-transistor is saturated,
   third circuit means coupled between said second circuit means and said thyristor for switching said thyristor into a conducting state upon receipt of said firing signal, wherein said third circuit means includes a pair of transistors arranged in a darlington configuration coupled between the anode electrode and gate electrode of said thyristor, said pair of transistors becoming conductive when said phototransistor is saturated and said transistor is non-conductive whereby said thyristor is swtiched into its conductive state; and
   fourth circuit means coupled across said thyristor between its anode and cathode electrodes for protecting said thyristor from misfiring and from being damaged by voltage transients thereacross, wherein said fourth circuit means comprises a parallel combination of a second resistor in series with a capacitor forming an RC snubber circuit across said thyristor for limiting the rate of rise of voltage thereacross, and a varistor in parallel across said RC snubber circuit for controlling forward and reverse voltage transients thereacross.

2. A circuit as recited in claim 1 further including a parallel diode resistor across the base to emitter of each of said darlington pair transistors, said resistors insuring higher blocking voltages capability of said darlington pair transistors.

3. A circuit as recited in claim 1 further including a diode coupled to the anode terminal of said thyristor for preventing destructive reverse currents from said power supply from flowing into said phototransistor, transistor and said pair of transistors.

4. A circuit as recited in claim 2 wherein said diodes in conjunction with said transistor place a short circuit between the thyristor gate electrode and cathode electrode when no switching signal exists thereby insuring that said thyristor will not be falsely gated on by eliminating pickups by the thyristor gate lead and improving the dv/dt rating of said thyristor.

5. A circuit for firing a thyristor into its conducting state, said thyristor having an anode electrode, cathode electrode and gate electrode, comprising:
   first circuit means for providing a gating signal in response to an input signal and comprising a light emitting diode for radiating light in response to said input signal,
   second circuit means for providing a firing signal upon receipt of said gating signal and comprising a phototransistor for detecting the light radiation of said light emitting diode, and a transistor coupled to the collector of said phototransistor
   third circuit means coupled between said second circuit means and said thyristor for switching said thyristor into a conducting state upon receipt of said firing signal, comprising a high gate drive circuit coupled to said gate electrode of said thyristor for providing a current pulse thereto for switching said thyristor from said nonconducting state to said conducting state, the drive circuit comprising a pair of transistors arranged in a darlington configuration coupled between the anode electrode and gate electrode of said thyristor, said pair of transistors being in a conductive state when said phototransistor is saturated and said transistor is nonconductive whereby said thyristor is switched into its conductive state, and
   fourth circuit means coupled across said thyristor between its anode and cathode electrodes for protecting said thyristor from misfiring and from being damaged by voltage transients thereacross, wherein said fourth circuit means comprises a parallel combination of a second resistor in series with a capacitor forming an RC snubber circuit across said thyristor for limiting the rate of rise of voltage thereacross, and a varistor in parallel across said RC snubber circuit for controlling forward and reverse voltage transients thereacross,
   an internal power supply, said power supply providing a fixed D.C. voltage, and comprising,
   a bridge rectifier, the cathode electrode of said thyristor being coupled to the anodes of the diodes of said rectifier.

6. A protection circuit for intentionally firing a thyristor and having protection means for preventing unintentional firing of said thyristor, the thyristor having an anode electrode, cathode electrode and gate electrode, comprising:
   first circuit means for providing a gating signal in response to an input signal and comprising a light emitting diode and first protection means for preventing application of reverse breakdown voltage to the light emitting diode sufficient for preventing damage to the diode, second circuit means for providing a firing signal upon receipt of the gating signal and comprising a phototransistor, a clamping circuit, and second protection means for diverting current from the clamping circuit when the phototransistor is saturated and, in cooperation with the clamping circuit, limiting the power supply voltage to the phototransistor, third circuit means coupled between the second circuit means and the thyristor for switching the thyristor into a conducting state upon receipt of the firing signal and comprising a third protection means connected to the gate of the thyristor for shunting the gate of the thyristor for preventing unintended signals from reaching the gate of the thyristor when the thyristor is in a non-conducting state, and fourth circuit and protection means coupled across the thyristor between its anode and cathode electrodes for protecting the thyristor from misfiring due to power supply voltage transients and comprising a parallel combination of a resistor in series with a capacitor forming an RC snubber circuit across the thyristor providing means for limiting the rate of rise of voltage across the thyristor, and a varistor connected in parallel across the RC snubber circuit for controlling forward and reverse voltage transients across the thyristor for preventing unintentional misfiring of the thyristor due to high voltage power supply transients.

* * * * *